United States Patent [19]

Nakai et al.

[11] Patent Number: 4,855,537
[45] Date of Patent: Aug. 8, 1989

[54] WIRING SUBSTRATE HAVING MESH-SHAPED EARTH LINE

[75] Inventors: Toshio Nakai, Tokyo; Takeshi Miyagi, Kawasaki; Osamu Shimada, Yokohama, all of Japan

[73] Assignee: Kabushiki Kaisha Toshiba, Kawasaki, Japan

[21] Appl. No.: 202,310

[22] Filed: Jun. 2, 1988

[30] Foreign Application Priority Data

Sep. 25, 1987 [JP] Japan ................................ 62-241402
Sep. 25, 1987 [JP] Japan ................................ 62-241403

[51] Int. Cl.$^4$ ............................................. H05K 1/00
[52] U.S. Cl. ................................................ 174/68.5
[58] Field of Search ..................................... 174/68.5

[56] References Cited

U.S. PATENT DOCUMENTS 3,293,353 12/1966 Hendriks et al. .................. 174/68.5
4,689,262 8/1987 Bloom ............................ 174/68.5 X

FOREIGN PATENT DOCUMENTS 61-290794 12/1986 Japan .
62-9697 1/1987 Japan .

OTHER PUBLICATIONS

Jarvela R. A. et al.; Wirability Enhancement; IBM Technical Disclosure Bulletin; vol. 21, No. 9; Feb. 1979; p. 3624.

Primary Examiner—Morris H. Nimmo
Attorney, Agent, or Firm—Oblon, Spivak, McClelland, Maier & Neustadt

[57] ABSTRACT

A circuit board comprises a mesh-shaped earth line including first earth lines extending in the X direction and second earth lines extending in the Y direction, an insulative layer formed on the earth line, and a signal line which is formed on the insulative layer to be insulated from the mesh-shaped earth line by the insulative layer. Among the first earth lines and the second earth lines, a line width of the portion of the signal line which crosses the earth lines which have a large crossing angle with the signal line is 0 or smaller than the line width of the earth lines which have a small crossing angle with the signal line among the first earth lines and the second earth lines.

12 Claims, 7 Drawing Sheets

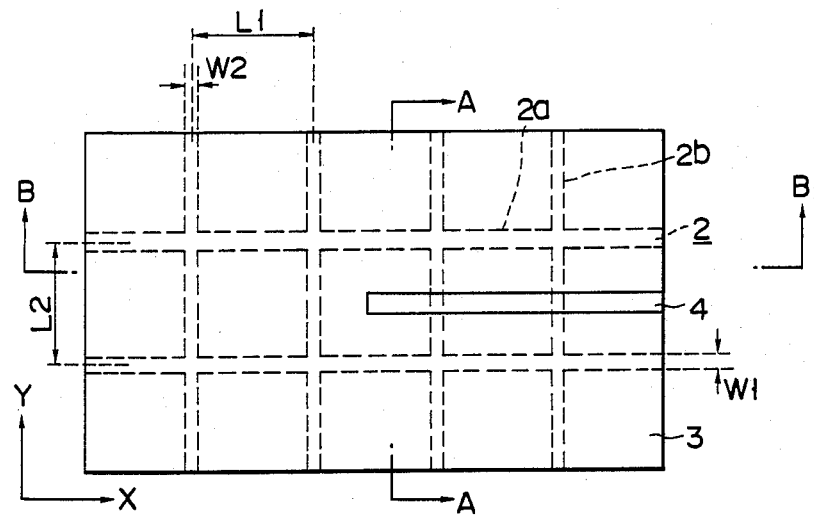
F I G. 1
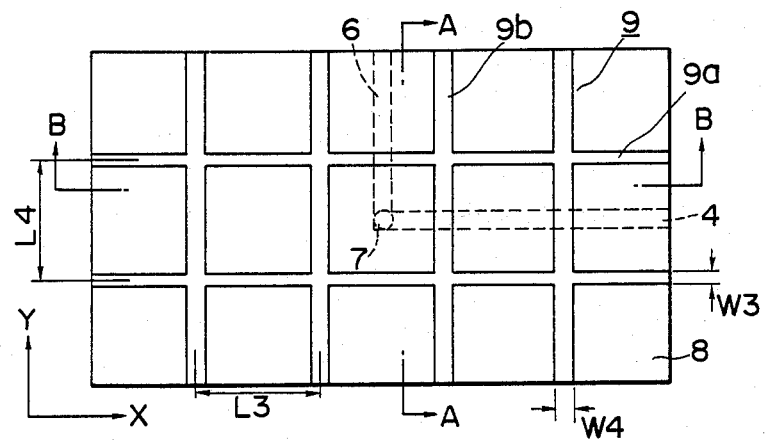
F I G. 2

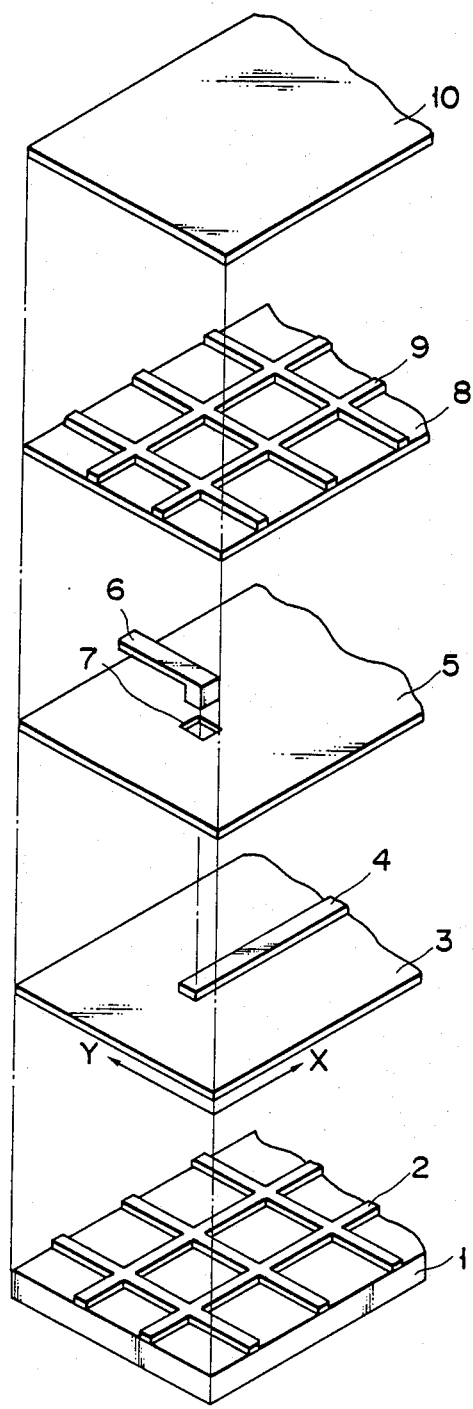
F I G. 5

WIRING SUBSTRATE HAVING MESH-SHAPED EARTH LINE

BACKGROUND OF THE INVENTION

1. Field of the Invention

The present invention relates to a circuit board and, more particularly, to a circuit board having mesh-shaped earth (ground) lines.

2. Description of the Related Art

The circuit board having the mesh-shaped earth lines is suitable to install integrated circuits which operate at high speeds. This is because when the mesh-shaped earth lines are used, the electrostatic capacity between the signal line and the earth line is smaller than that in the case of using a sheet-shaped earth layer.

When the mesh-shaped earth lines are used, electrostatic capacity C between the earth line and the signal line differs on the position on the signal line. For example, in the crossing portion of the signal line and the earth lines, electrostatic capacity C between them is large. In the other portions of the signal line and the earth line, capacity C is relatively small. When electrostatic capacity C is not constant on the signal line, the characteristic impedance $$\left(\alpha \frac{1}{\sqrt{C}}\right)$$

is not constant on the signal line as well. Therefore, the conventional circuit board having the mesh-shaped earth lines has drawbacks such that if an impedance mismatching occurs on the signal line, the signal propagation characteristics will be poor.

SUMMARY OF THE INVENTION

It is an object of the present invention to provide a circuit board in which a mesh-shaped earth line is used and an almost constant characteristic impedance is obtained at an arbitrary position on the signal line.

To accomplish this object, a circuit board according to the invention having:

a mesh-shaped earth line (2) including a first group of earth lines (2a) extending in the first direction (X) and a second group of earth lines (2b) extending in the second direction (Y) which is different from that of the first direction (X);

an insulative layer (3) formed on the earth line (2); and a signal line (4) formed on the insulative layer (3) to be insulated from the mesh-shaped earth line (2) by the insulative layer (3) and extending in a predetermined direction, wherein the earth lines (2a) in one of said groups extend at a first angle to said signal line (4) and have, at least at that portion crossing said signal line (4), a first width, and the earth lines (2b) in the other group extend at a second angle greater than the first angle and have, at least at that portion crossing said signal line (4), a second width smaller than the first width or zero.

With this structure, in the circuit board according to the invention, since a variation in electrostatic capacity at an arbitrary position on the signal line is smaller than that in the conventional wiring substrate, the characteristic impedance on the signal line is uniformed as compared with the conventional one. Thus, the signal propagation characteristic of the circuit board according to the invention is good.

BRIEF DESCRIPTION OF THE DRAWINGS

FIGS. 1 to 5 are diagrams for explaining a structure of a circuit board according to the first embodiment of the present invention;

DETAILED DESCRIPTION OF THE PREFERRED EMBODIMENTS

The first embodiment of the present invention will be described hereinbelow with reference to FIGS. 1 to 5.

Figure 3:
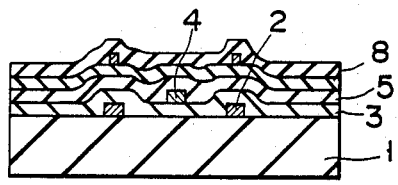
Figure 4:
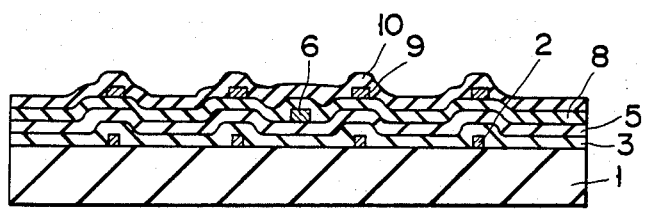

FIGS. 1 to 5 show a circuit board according to the first embodiment of the invention. FIG. 1 shows the relation between a first mesh-shaped earth line and a first signal line. FIG. 2 shows the relation between a second signal line and a second mesh-shaped earth line. FIGS. 3 and 4 show the cross sectional views of the circuit board taken along the lines AA and BB in FIGS. 1 and 2, respectively. FIG. 5 is a schematic perspective view of the circuit board according to the embodiment.

In FIGS. 1 to 5, insulative substrate 1 is made of, e.g., ceramics, glass, or resin and has a thickness of about 1 mm. Mesh-shaped earth line 2 (hereinafter, referred to as a first mesh-shaped earth line) is formed on substrate 1. First mesh-shaped earth line 2 comprises earth lines 2a extending in an X direction and earth lines 2b extending in a Y direction. First mesh-shaped earth line 2 has a three-layer structure of, e.g., Ti, Cr, and Ti and has a thickness of 5 μm. Line width W1 of each earth line 2a extending in the X direction is set to, for example, 200 μm. Line width W2 of each earth line 2b extending in the Y direction is set to, e.g., 100 μm. Interval L1 between earth lines 2b is set to, e.g., 1 mm. Interval L2 between earth lines 2a is also set to, e.g., 1 mm. First insulative layer 3 having a thickness of, for example, 15 to 20 μm is formed on first mesh-shaped earth line 2. Signal line 4 (hereinafter, referred to as an X-direction signal line) extending in the X-direction is formed on first insulative layer 3. X-direction signal line 4 has a three-layer structure of, e.g., Ti, Cr, and Ti and has a thickness of 5 μm and a line width of 200 μm.

Second insulative layer 5 is formed on X-direction signal line 4. Second insulative layer 5 is made of, for instance, polyimide and has a thickness of 15 to 20 μm. Second signal line (hereinafter, referred to as a Y-direction signal line) 6 extending in the Y direction is formed on second insulative layer 5. Y-direction signal line 6 has a three-layer structure of Ti, Cr, and Ti and has a thickness of 5 μm and a width of 200 μm. Y-direction signal line 6 is electrically connected to X-direction signal line 4 through through-hole 7 formed in second insulative layer 5.

Third insulative layer 8 is formed on Y-direction signal line 6. Third insulative layer 8 is made of polyimide and has a thickness of 15 to 20 μm. Mesh-shaped earth line 9 (hereinafter, referred to as a second mesh-shaped earth line) is formed on third insulative layer 8. Second mesh-shaped earth line 9 comprises earth lines 9a extending in the X direction and earth lines 9b extending in the Y direction. Second mesh-shaped earth line 9 has a three-layer structure of, e.g., Ti, Cr, and Ti and has a thickness of 5 μm. Line width W3 of each earth line 9a extending in the X direction is set to, e.g., 100 μm. Line width W4 of each earth line 9b extending in the Y direction is set to 200 μm. Interval L3 between earth lines 9b is set to, for example, 1 mm. Interval L4 between earth lines 9a is also set to 1 mm.

Fourth insulative layer 10 is formed on second mesh-shaped earth line 9. Fourth insulative layer 10 functions as a protective layer for covering the whole surface of the circuit board such that the metal portions other than the portions which connect ICs and parts are not exposed to the surface of the circuit board.

Signal lines 4 and 6 are connected to high speed operation devices, for example, hetero bipolar transistors of a compound semiconductor, for example, the InPGaAs, high mobility transistors and so on, and transmit a signal of a high frequency, for instance, a signal whose wavelength has a value of the mm order.

In the circuit board with the structure shown in FIGS. 1 to 5, line width W2 of earth line 2b is narrower than line width W1 of earth line 2a. Thus, the area in which portions of X-direction signal line 4 and first mesh-shaped earth line 2 overlap is relatively smaller than the overlapping areas in the conventional substrate, and the electrostatic capacity between the overlapping portions is relatively smaller than that of the conventional circuit board. The electrostatic capacity between signal line 4 and first mesh-shaped earth line 2 is relatively uniform (although it is not perfectly uniform) as compared with that of the conventional circuit board. Therefore, the characteristic impedance $$\left( \alpha \frac{1}{\sqrt{C}} \right)$$

of X-direction signal line 4 is also uniformed as compared with that of the conventional circuit board.

Similarly, line width W3 of earth line 9a is also narrower than line width W4 of earth line 9b. The area of the overlapping portions of Y-direction signal Line 6 and second mesh-shaped earth line 9 is smaller than that of the conventional circuit board. Therefore, the electrostatic capacity of the overlapping portions of second mesh-shaped earth line 9 and signal line 6 is smaller than that of the conventional circuit board. The electrostatic capacity between signal line 6 and second mesh-shaped earth line 9 is uniform as compared with that of the conventional circuit board. Therefore, the characteristic impedance $$\left( \alpha \frac{1}{\sqrt{C}} \right)$$

of Y-direction signal line 6 is also uniformed as compared with the conventional circuit board.

In the circuit board of the first embodiment, the characteristic impedances in signal lines 4 and 6 are relatively constant, and this circuit board has a good signal propagation characteristic.

An example of a method for manufacturing the circuit board according to the first embodiment will now be explained.

(1) A Ti layer is formed by means of an evaporation process on substrate 1 made of ceramics or the like. A Cr layer is then formed on the Ti layer by means of the evaporation process. Another Ti layer is further formed on the Cr layer by means of the evaporation process. A three-layer film of Ti, Cr, and Ti is formed by way of the above processes on substrate 1 so as to have a thickness of about 5 μm. A resist is then coated on the three-layer film. This resist is exposed, developed, and patterned. The three-layer film is etched using the patterned resist as a mask (PEP process). Thus, first mesh-shaped earth line 2 consisting of X-direction earth lines 2a each having a width of 200 μm and Y-direction earth lines 2b each having a width of 100 μm is formed.

(2) Polyimide precursor is coated on the resultant structure so as to have a thickness of 15 to 20 μm. The coated polyimide precursor layer is baked, so that first polyimide insulative layer 3 is formed. The three-layer film of Ti, Cr, and Ti having a thickness of about 5 μm is formed on first insulative layer 3 by means of the evaporation process. A resist is then coated on the three-layer film and patterned. The three-layer film is etched by using the patterned resist as a mask, so that X-direction signal line 4 having a width of about 200 μm is formed.

(3) Photosensitive polyimide precursor is coated on the resultant structure so as to have a thickness of about 15 to 20 μm. The photosensitive polyimide precursor layer is prebaked, exposed, developed, and postbaked. Thus, second polyimide insulative layer 5 having through hole 7 is formed. The three-layer film of Ti, Cr, and Ti formed on second insulative layer 5 by the evaporation process, so as to have a thickness of about 5 μm. A resist is then coated on the three-layer film and patterned. Y-direction signal line 6 having a width of about 200 μm is formed by using the patterned resist as a mask.

(4) Polyimide precursor is coated on the resultant structure so as to have a thickness of about 15 to 20 μm. This polyimide precursor layer is baked, so that third polyimide insulative layer 8 is formed. Next the three-layer film of Ti, Cr, and Ti is formed by the evaporation process on third insulative layer 8 so as to have a thickness of about 5 μm. A resist is then coated on this three-layer film and patterned. Second mesh-shaped earth line 9 consisting of earth lines 9b each having a width of about 200 μm and extending in the Y direction and earth lines 9a each having a width of about 100 μm and extending in the X direction are formed using the patterned resist as a mask.

(5) Polyimide precursor is coated on the resultant structure. This polyimide precursor layer is baked, so that fourth polyimide insulative layer 10 is formed. The surface of the substrate is covered by the fourth insulative layer 10, thereby providing a structure such that no metal is exposed to the surface other than the connecting portions of ICs and parts.

In the first embodiment, the earth line which is in parallel with the signal line is wide and has constant width and the earth line which perpendicularly crosses the signal line is narrow and has a constant width. Namely, the earth line having a small crossing angle with the signal line is wide and the earth line having a large crossing angle with the signal line is narrow. Therefore, even if the arrangement of the signal lines is changed, there should be no reason to change the mesh-shaped earth line so long as the direction of the signal lines is specified, so that the mesh-shaped earth line has a high generality. On the other hand, one exposing mask can be commonly used to manufacture a plurality of mesh-shaped earth lines.

Figure 6:
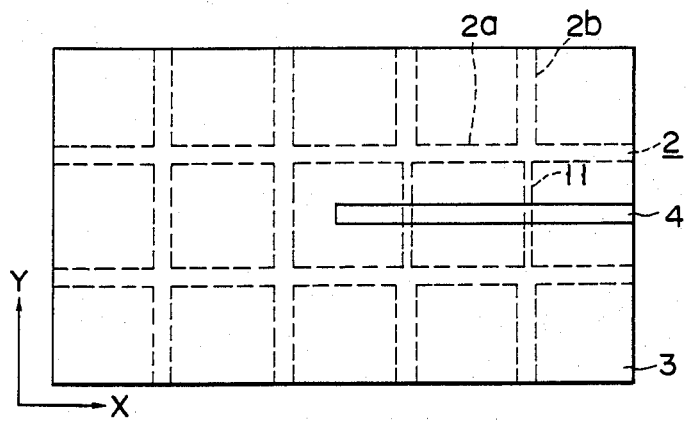
FIGS. 6 and 7 are diagrams for explaining a circuit board according to the second embodiment of the invention.
Figure 7:
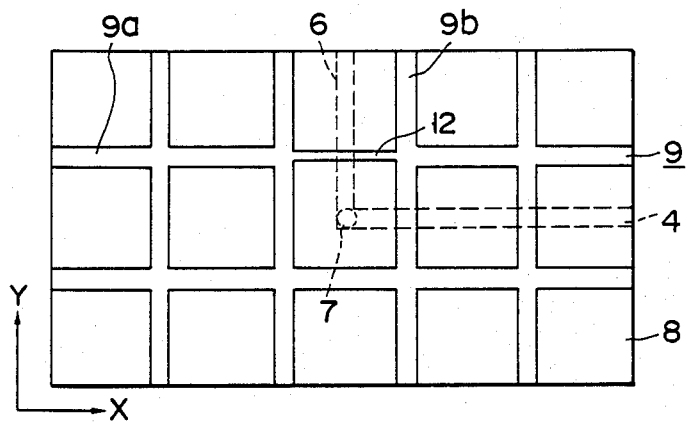

The second embodiment of the invention will now be described with reference to FIGS. 6 and 7. FIG. 6 corresponds to FIG. 1 and shows the relation between the X-direction signal line and the first mesh-shaped earth line. FIG. 7 corresponds to FIG. 2 and shows the relation between the Y-direction signal line and the second earth line. In FIGS. 6 and 7, the same parts and components are designated by the same reference numerals as those shown in FIGS. 1 and 2, and their descriptions are omitted for this reason. In the second embodiment, among earth lines 2b extending in the Y direction, only the line width of portion 11 which crosses X-direction signal line 4 is narrower than the line widths of the other portions of earth lines 2b. Among earth lines 9a extending in the X direction, only the line width of portion 12 which crosses Y-direction signal line 6 is narrower than the line width of the other earth line 2.

In the second embodiment, the areas in which portions of the signal line and the earth line overlap are smaller than the overlapping areas in the conventional substrate. Therefore, the electrostatic capacity between the signal line and the earth line is uniform as compared with that of the conventional circuit board. The characteristic impedances of signal lines 4 and 6 are also uniform as compared with those of the conventional circuit board. In this embodiment, since most of the lines of the portions of mesh-shaped earth lines 2 and 9 are wide, their grounding efficiency is better than that of the first embodiment.

Figure 8:
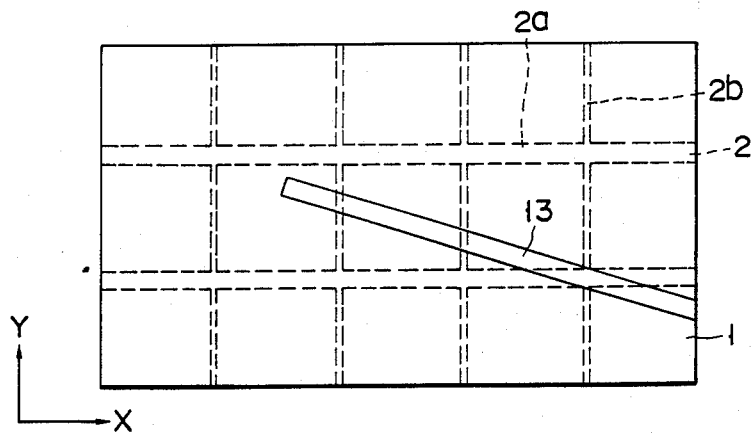
FIGS. 8 and 9 are diagrams for explaining a structure of a circuit board according to the third embodiment of the invention.

In the first and second embodiments, the signal line and the mesh-shaped earth lines perpendicularly cross one another. The invention can be also applied to a circuit board having a structure such that the signal line and the mesh-shaped earth lines obliquely cross one another. This embodiment will now be described with reference to FIGS. 8 and 9. In first mesh-shaped earth line 2 of FIG. 8, the line width of each earth line 2b having a large crossing angle with signal line 13 is narrower than the line width of earth line 2a having a small crossing angle with signal line 13. With this structure, similarly to the first and second embodiments, the areas in which the portions of the earth line and the signal line overlap are reduced and the characteristic impedances are relatively uniform. Similarly to the first embodiment, in the embodiment of FIG. 8, the generality of the mesh-shaped earth line is high and the mesh-shaped earth line can be easily manufactured.

Figure 9:
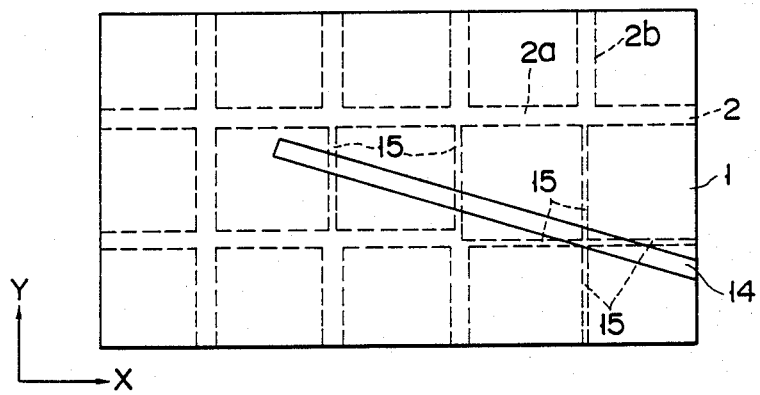

As shown in FIG. 9, it is also possible to form the earth lines in such a manner that only the line width of portion 15 in mesh-shaped earth line 2 crossing the signal line 14 is narrower than the line widths of the other earth lines. With this structure, the characteristic impedance of signal line 14 is further uniformed than that of signal line 13 in FIG. 8.

Figure 10:
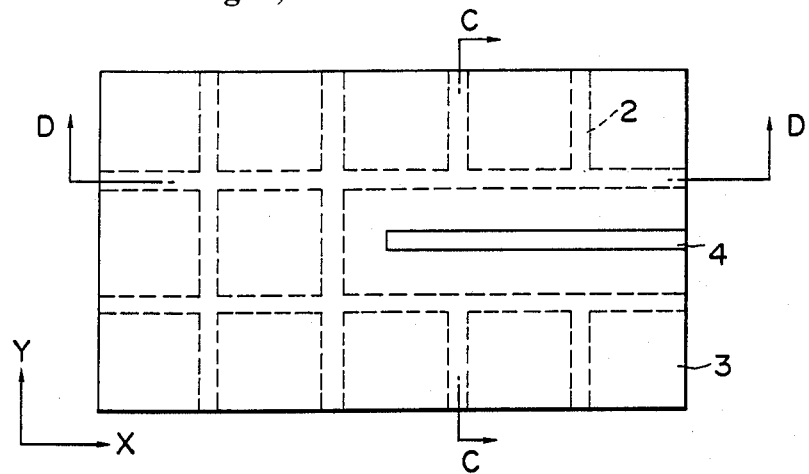
FIGS. 10 to 13 are diagrams for explaining a structure of a circuit board according to the fourth embodiment of the invention.
Figure 11:
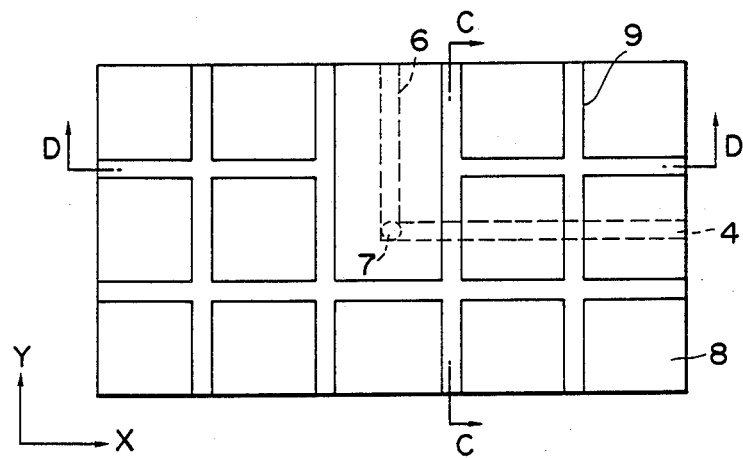
Figure 12:
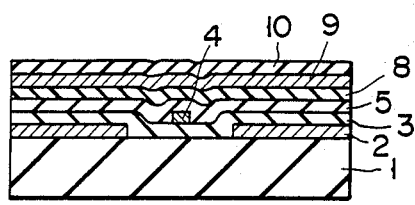
Figure 13:
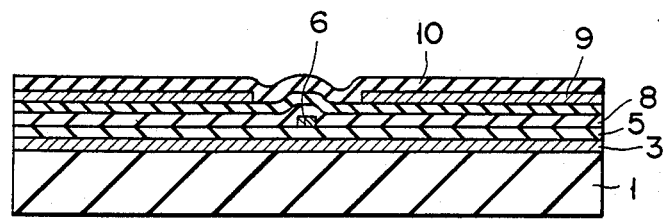

In the first to third embodiments, the widths of the earth lines are made to be different from one another. However, the mesh-shaped earth line can also be formed so as not to cross the signal line (it is also possible to consider such that the line width of the crossing portion is narrowed to 0). The fourth embodiment will be described with reference to FIGS. 10 to 13. FIG. 10 corresponds to FIG. 1 and shows the relation between the first mesh-shaped earth line and the X-direction signal line formed thereon. FIG. 11 corresponds to FIG. 2 and shows the relation between the signal line and the second mesh-shaped earth line formed thereon. FIGS. 12 and 13 show cross sectional views of the circuit board taken along the lines CC and DD in FIGS. 10 and 11, respectively. In FIGS. 10 to 13, the same parts and components are designated by the same reference numerals as those shown in FIGS. 1 to 4, and their descriptions are omitted for this reason.

In FIGS. 10 to 13, first mesh-shaped earth line 2 is formed so as to not cross (or overlap) X-direction signal line 4 (so as to have a shape from which the crossing portions (or overlapping portions) are eliminated).

Second mesh-shaped earth line 9 is formed so as not to cross (or overlap) Y-direction signal line 6.

In the fourth embodiment, first mesh-shaped earth line 2 and X-direction signal line 4 do not cross one another. The distance between line 2 and line 4 is almost constant at any position of X-direction signal line 4. Therefore, the electrostatic capacity between line 2 and line 4 is also almost constant at any position of the signal line. The characteristic impedance $$\left(\alpha \frac{1}{\sqrt{C}}\right)$$

is also constant. Similarly, second mesh-shaped earth line 9 and Y-direction signal line 6 do not cross one another, and the distance between line 6 and line 9 is almost constant at any position of Y-direction signal line 6. Therefore, the electrostatic capacity between lines 6 and 9 is also almost constant at any position of signal line 6 and the characteristic impedance $$\left(\alpha \frac{1}{\sqrt{C}}\right)$$

is also almost constant.

The fourth embodiment can also be applied to the circuit board having a structure such that the signal line and the mesh-shaped earth line obliquely cross one another, when the mesh-shaped earth line is virtually extended. In this case, the mesh-shaped earth line can also be formed in a manner such that each of the earth lines having a large angle with the signal line (the crossing angle between the signal line and each of the earth lines when the earth lines are virtually extended) which does not cross the signal line. On the other hand, it is also possible to construct the earth lines such that the earth line and the signal line do not cross irrespective of the angle between the earth line and the signal line.

This invention is particularly advantageous when the interval between the earth lines is nearly equal to or larger than that of the signal wavelength which is transmitted through the signal line. Therefore, for example, in the case where intervals L1 and L2, shown in FIG. 1, are set to 1 mm and the wavelength of the signal is 2 mm or less, the invention is particularly effective. The invention is not limited to the above materials and dimensions shown in the foregoing embodiments.

EXPERIMENT

The characteristic impedances of the circuit board according to the first and fourth embodiments and of the conventional circuit board were measured by using a TDR (Time Domain Reflectometry). The results of the measurements are shown in FIG. 14.

Figure 14:
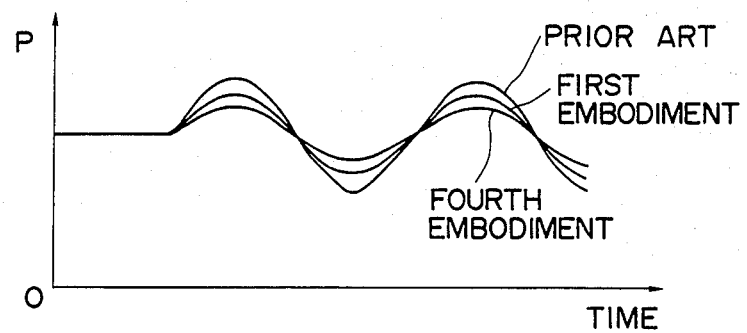
FIG. 14 is a diagram showing the comparison of the characteristics of the conventional circuit board and the characteristics of the circuit board according to the first and fourth embodiments.

In FIG. 14, the vertical axis indicates the reflection coefficient P and the horizontal axis represents the period of time which is required for a reflection signal to be received after a signal has been output to the signal line.

As will be obvious from FIG. 14, as compared with the conventional circuit board, the change in the characteristic impedance of the circuit board according to the first embodiment is small. Further, the characteristic impedance of the circuit board according to the fourth embodiment is extremely small. It can also be seen from these experiments that the circuit board of this invention displays excellent characteristics.

What is claimed is:

1. A circuit board comprising:
  mesh-shaped earth line means including a first group of earth lines extending in a first direction and a second group of earth lines extending in a second direction which is different from said first direction;
  insulative layer means formed on said earth line means; and
  signal wiring means formed on said insulative layer means and insulated from said mesh-shaped earth line means by the insulative layer means and extending in a predetermined direction,
  wherein the earth lines in one of said groups extend at a first angle to said signal wiring means and have a first width at least at a portion of said earth lines in said one group, and the earth lines in the other group extend at a second angle greater than the first angle and have a second width smaller than the first width at at least a portion of said earth lines in said other group crossing said signal wiring means.

2. A circuit board according to claim 1, wherein said signal wiring means is substantially in parallel with the earth lines in the first group, and the line widths of the earth lines in the second group are substantially fixed and narrower than the line widths of the earth lines in the first group.

3. A circuit board according to claim 1, wherein said signal line means is substantially in parallel with the earth lines in the first group, and the line width of each of the portions where the earth lines in the second group cross the signal line means is narrower than the width of each of the earth lines in the first group.

4. A circuit board according to claim 1, wherein the line widths of the portions of the earth lines in the first and second groups which cross the signal line means are narrower than the line widths of the other portions of the earth lines of the first and second groups which do not cross the signal line means.

5. A circuit board according to claim 1, further comprising:
  second insulative layer means formed on the signal wiring means;
  second signal wiring means formed on the second insulative layer means and extending in a direction which is different from that of the first signal wiring means;
  third insulative layer means formed on the second signal wiring means; and
  second mesh-shaped earth line means, including a third group of earth lines in a third direction and a fourth group of earth lines in a fourth direction which is different from said third direction, formed on the third insulative layer means,
  wherein the earth lines in one of said third and fourth groups extend at a third angle to said second signal wiring means and have at least a third width at a portion of said one of said third and fourth groups, and the earth lines in the other group extend at a fourth angle greater than the third angle and have at least a fourth width smaller than the third width at a portion of said other of said third and fourth groups crossing said second signal wiring means.

6. A circuit board comprising:
  mesh-shaped earth line means including a first group of earth lines extending in a first direction and a second group of earth lines extending in a second direction which is different from that of the first direction;
  insulative layer means formed on the earth line means; and
  signal wiring means formed on the insulative layer means to be insulated from the mesh-shaped earth line means by the insulative layer means and extending in a predetermined direction,
  wherein the earth lines in one of the groups extend at a first angle to said signal wiring means, and the earth lines in the other group extend at a second angle which is greater than that of the first angle to the signal wiring means, with the earth lines in the other group and the signal wiring means not overlapping one another.

7. A circuit board according to claim 6, wherein said earth lines in said first and second groups are formed into shapes in which portions of said earth lines which would otherwise cross the signal line means when said earth lines are virtually extended are eliminated.

8. A circuit board according to claim 6, wherein said signal line means is substantially in parallel with the earth lines in the first group, and the earth lines in the second group are formed so as not to cross the signal line means.

9. A circuit board according to claim 6, wherein earth lines in both of the first and second groups are formed so as not to cross the signal line means.

10. A circuit board according to claim 6, further comprising:
  second insulative layer means formed on the signal line means;
  second signal line means formed on the second insulative layer means;
  third insulative layer means formed on the second signal line means; and
  second mesh-shaped earth line means formed on the third insulative layer means,
  and wherein said second mesh-shaped earth line means is formed so as not to overlap the second signal line means.

11. A circuit board comprising:
  mesh-shaped earth line means including a plurality of earth lines;
  an insulative layer formed on the earth line means; and a signal line means insulated from the mesh-shaped earth line by the insulative layer and extending in a predetermined direction;

wherein at least one of the earth lines crosses the signal line and at least one of the earth lines does not cross the signal line, and the at least one earth line crossing the signal line has a line width at a portion crossing said signal line which is narrower than a line width of the at least one earth line which does not cross the signal line.

12. A circuit board comprising:

mesh-shaped earth line means including a plurality of earth lines;

an insulative layer formed on the earth line means; and a signal line insulated from the mesh-shaped earth line means by the insulative layer and extending in a predetermined direction;

wherein none of the earth lines of said mesh-shaped earth line means crosses said signal line.

* * * * *